("12") United States Patent  (10) Patent No.: US 9,948,237 B2
Anderson et al.  (45) Date of Patent: Apr. 17, 2018

(54) APPARATUS AND METHOD FOR FILTERING RADIO FREQUENCY SIGNALS OF TRANSCEIVER INTEGRATED CIRCUITS

(71) Applicant: Cambium Networks Limited, Ashburton, Devon (GB)

(72) Inventors: Scott R. Anderson, South Barrington, IL (US); Ted J. Beck, Park Ridge, IL (US)

(73) Assignee: CAMBIUM NETWORKS LIMITED, Ashburton, Devon (GB)

(*) Notice: Subject to any disclaimer, the term of this patent is extended or adjusted under 35 U.S.C. 154(b) by 0 days.

(21) Appl. No.: 15/605,248

(22) Filed: May 25, 2017

(65) Prior Publication Data

US 2017/0264243 A1  Sep. 14, 2017

Related U.S. Application Data

(63) Continuation of application No. 14/604,331, filed on Jan. 23, 2015, now Pat. No. 9,680,415.

(51) Int. Cl.
| | |
|---|---|
| *H04B 1/40* | (2015.01) |
| *H03D 7/14* | (2006.01) |
| *H04B 15/06* | (2006.01) |
| *H04L 27/26* | (2006.01) |
| *H04B 7/0413* | (2017.01) |
| *H04B 1/00* | (2006.01) |

(52) U.S. Cl.
CPC ............. *H03D 7/14* (2013.01); *H04B 1/40* (2013.01); *H04B 7/0413* (2013.01); *H04B 15/06* (2013.01); *H04L 27/2626* (2013.01); *H04L 27/2647* (2013.01); *H04B 1/006* (2013.01)

(58) Field of Classification Search
CPC .......... H03D 7/14; H04B 1/40; H04B 7/0413; H04B 15/06; H04B 1/006
USPC ........................................................ 375/267
See application file for complete search history.

(56) References Cited

U.S. PATENT DOCUMENTS

| | | |
|---|---|---|
| 6,405,025 B1 | 6/2002 | Keski-mattinen |
| 6,411,256 B1 | 6/2002 | Lier et al. |
| 7,965,684 B2 | 6/2011 | Gauthier |

(Continued)

OTHER PUBLICATIONS

International Search Report and Written Opinion from corresponding European patent application No. PCT/GB2016/050136, dated Sep. 2, 2016.

*Primary Examiner* — Michael Neff
(74) *Attorney, Agent, or Firm* — Brinks Gilson & Lione

(57) ABSTRACT

Devices and methods are disclosed for generating, filtering, and amplifying signals that are sent and received using SOCs. These improved methods and devices advantageously provide filtering of composite RF signals such that the RF signals can be transmitted with an improved SNR. Such filtered signals can then be transmitted at a higher power. Because filtering is performed at an intermediate frequency, the higher cost of low-noise RF-transmitters and/or RF filtering components can be avoided. Accordingly, less expensive (e.g., noisier) components, such as readily available wireless transceiver SOCs, can be used for generating RF signals, filtering the signals, and then transmitting the filtered signals at higher power. As a result of these devices and methods, inexpensive SOCs may be used at higher powers and over longer ranges than would be normally expected.

18 Claims, 9 Drawing Sheets

(56) References Cited

U.S. PATENT DOCUMENTS

| | | | |
|---|---|---|---|
| 8,340,619 B1* | 12/2012 | Shirvani-Mahdavi | H04B 1/26 |
| | | | 327/359 |
| 2004/0264594 A1* | 12/2004 | Kasai | G01S 7/35 |
| | | | 375/296 |
| 2006/0223558 A1 | 10/2006 | Behzad | |
| 2007/0238419 A1 | 11/2007 | Dubois et al. | |
| 2008/0142586 A1 | 6/2008 | Murakami | |
| 2009/0258629 A1 | 10/2009 | Ritchey | |
| 2014/0269865 A1 | 9/2014 | Aparin | |
| 2014/0364078 A1 | 12/2014 | Richley | |

* cited by examiner

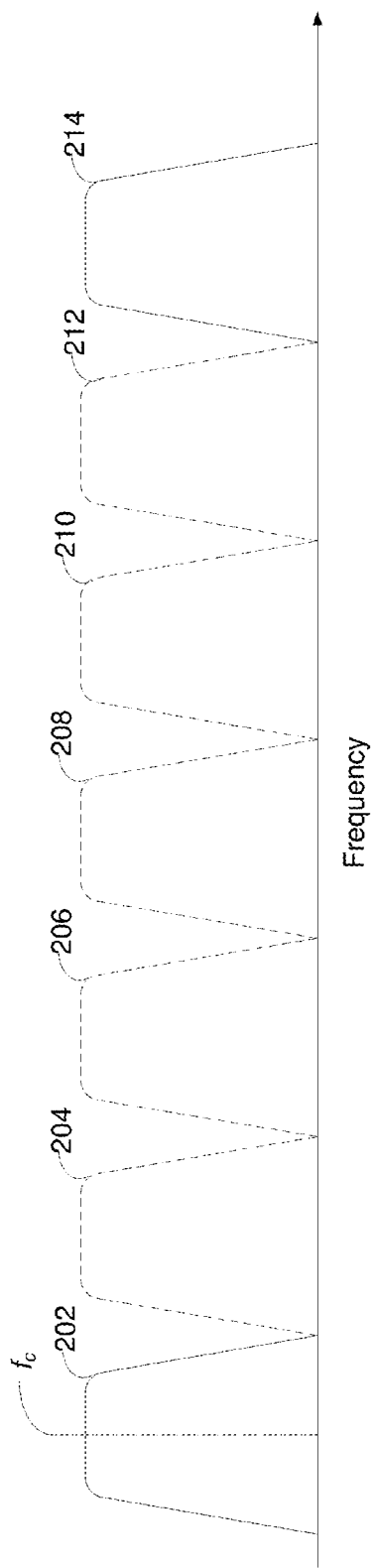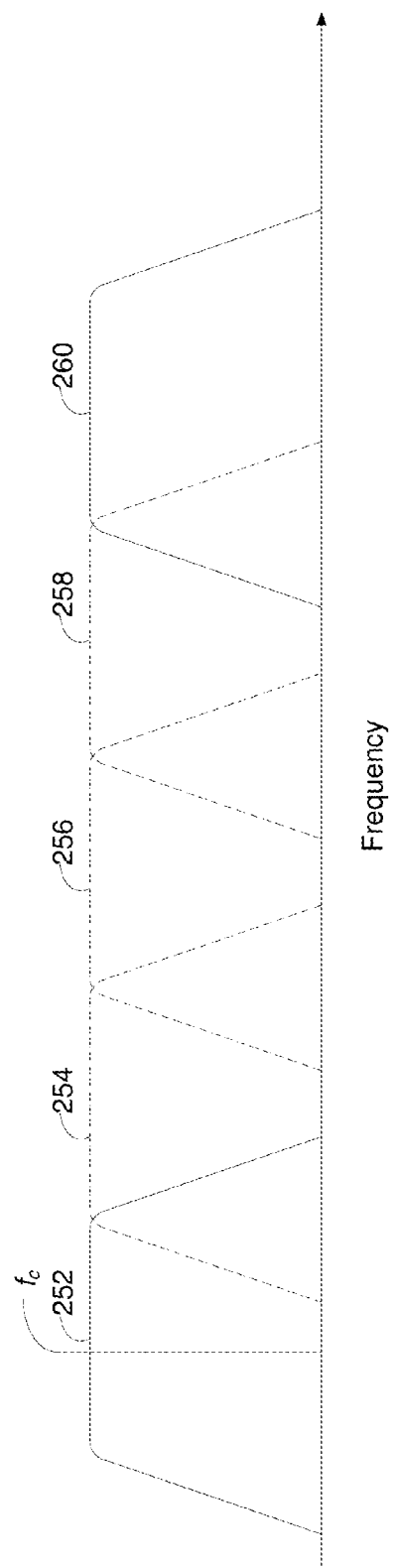

APPARATUS AND METHOD FOR FILTERING RADIO FREQUENCY SIGNALS OF TRANSCEIVER INTEGRATED CIRCUITS

CROSS REFERENCE TO RELATED APPLICATIONS

This application is a continuation of U.S. application Ser. No. 14/604,331, filed Jan. 23, 2015, granted as U.S. Pat. No. 9,680,415 on Jun. 13, 2017, the entirety of which is incorporated herein by reference.

TECHNICAL FIELD

This application relates generally to wireless communication systems. More specifically, this application relates to a wireless communication device adapted to filter noise signals from an information signal.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The development of low cost wireless chipsets has allowed the development of low cost wireless communication devices. Such communication devices have been deployed by wireless internet service providers (WISP) to provide consumers located in remote, underserved areas access to the internet. Typically such communication devices are part of a wireless communication network. It is desirable to improve the signal quality of the transmissions of low cost wireless chipsets while reducing interference with other wireless communication networks operating in the vicinity of the wireless communication network.

SUMMARY

In order to address the need to improve the operational efficiency of low-cost wireless communication devices, apparatus are disclosed herein for improving the signal quality of information signals and filtering noise signals.

In particular, disclosed is a wireless device having a system on a chip (SOC) that generates a composite radio frequency (RF) signal at an output. The composite RF signal may include RF signals that are within a desired frequency band (e.g., the information signal) and RF signals outside of the desired frequency band (e.g., noise). The wireless device may have a local oscillator (LO) for generating a LO signal for use by a transceiver that may include a down-converting mixer, an up-converting mixer, and a pass-band filter. The down-converting mixer may have its inputs connected with the output of the SOC and output of the LO. In addition, the output of the down converting mixer is connected with the input of a band pass filter. The inputs of the up converting mixer connects with the output of the band pass filter and output of the LO.

Other features and advantages will become apparent upon review of the following drawings, detailed description and claims. Additionally, other embodiments are disclosed, and each of the embodiments can be used alone or together in combination. Exemplary embodiments will now be described with reference to the attached drawings.

BRIEF DESCRIPTION OF THE DRAWINGS

FIG. 2A illustrates non-overlapping wireless communication channels having a bandwidth in accordance with one embodiment.

FIG. 2B illustrates overlapping wireless communication channel having a second bandwidth in accordance with another embodiment.

DETAILED DESCRIPTION

Figure 1:
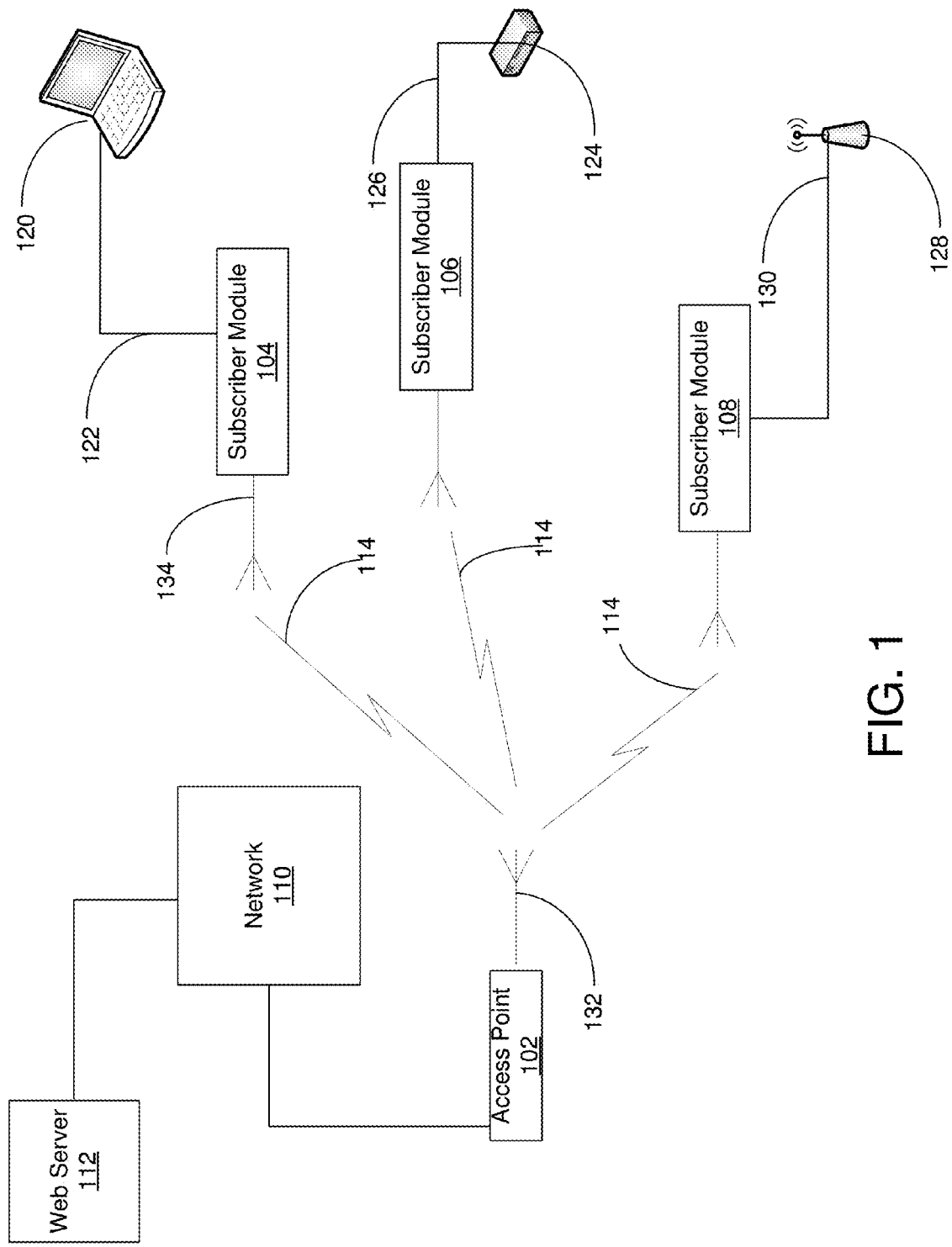
FIG. 1 illustrates an exemplary wireless communication system that may include embodiments for filtering composite RF signals.

Devices and systems described herein improve wireless communication of data between devices of a communication system such as exemplary communication system 100 of FIG. 1. A non-exclusive list of data types that may be communicated between the devices of system 100 of FIG. 1 includes voice, video, graphics and text content. Improvements may be realized by utilizing a combination of several signal conditioning techniques described herein. By way of example and without limitation, signal conditioning as used herein may include filtering and amplification of electrical signals corresponding to the data being received and transmitted. In a preferred embodiment, improvements may be realized by improving the signal quality of the wireless signals representative of the data generated by a wireless device and by filtering wireless signals generated by the wireless device that are not representative of the data.

Typically, devices in communication system 100 communicate wirelessly by the transmission and reception of wireless signals with frequencies in the radio frequency (RF) range, i.e. anywhere from 3 Kilohertz to 300 Gigahertz. Generally, to communicate data wirelessly, a device generates electrical RF signals having the desired frequencies, modulates the generated electrical RF signals with the data that is to be communicated and transmits the modulated electrical RF signals via one or more energy radiating surfaces, antennas for example, of the device. The antenna converts electrical RF signals to energy which is then radiated or transmitted from the antenna and converts received energy impinging on the antenna into electrical RF signals.

By way of example and without limitation, communication system 100 includes an access point (AP) 102 and several subscriber modules (SMs) 104-108. The access point 102 and SMs 104-108 correspond to devices in the communication system 100. In one embodiment, access point 102 is configured to establish a wired communication channel to the network 110 via wired connection 112. As used herein, a wired communication channel mean a communication channel established via a physical medium such as copper wire or optical cable, for example. The access point 102 may transmit and receive data to and from other devices connected to the network 110 via the wired communication channel. Web server 112 is an exemplary device connected to network 110 that may transmit data to and receive data from access point 102 via the wired communication channel. The wired communication channel may operate in accordance with a communication standard such as Institute of Electrical and Electronics Engineers standard (IEEE) 802.3, IEEE 802.5, and fiber distributed data interface (FDDI) with network 110 via the wired connection 112. The transmission and reception of data may take place in accordance with a networking protocol such as transmission control protocol/internet protocol (TCP/IP).

The access point 102 is also configured to establish a wireless communication channel 114 with SMs 104-108. The wireless communication channel 114 may operate in accordance with a wireless communication standard. IEEE 802.11 n is an exemplary wireless communication standard suitable for use with the communication system 100. A wireless communication channel generally includes RF signals having predetermined frequencies. Communication of data via the wireless communication channel is effectuated by generating the RF signals at the predetermined frequencies, modulating the generated RF signals with the data and transmitting the modulated RF signals. The assignment of frequencies to a wireless communication channel may be specified by the wireless communication standard.

SMs 104-108 are also similarly configured to establish respective wired and wireless communication channels. In an embodiment, SM 104 is configured to establish a communication channel with a user device such as computer 120 via a wired connection 122. In this embodiment, SM 106 is configured to establish a communication channel with a switch 124 via a wired connection 126. SM 108 is configured to establish a communication channel with a wireless router 128 via a wired connection 130.

AP 102 and SM 104 for example, operate as switches that communicatively couple a device connected to the wired connection of an SM, computer 120 for example, to the network 110 via a wireless communication channel 114, for example, established between AP 102 and SM 104. This enables computer 120 to be in data communication with web server 112, for example.

Access point 102 may include circuitry that decodes data received from network 110 and encodes and formats the received data into RF signals representative of the data. Access point 102 may include componentry that generates RF signals having a range of frequencies. The received data may be used to modulate the RF signals and the modulated RF signals may be applied to the antenna 132. Antenna 132 may cause the transmission of energy representative of the RF signals via communication channel 114 at a predetermined power level. The antenna 134 of SM 104, for example, may receive the transmitted energy and convert the energy into RF signals representative of the data. Circuitry in SM 104 may then demodulate and decode the RF signals into the data that was received by AP 102 from network 110. The decoded data may then be transmitted to computer 120 via the wired connection 122.

Similarly, SM 104 may include circuitry that decodes data received from computer 120 and encodes and formats the received data received into RF signals representative of the data. Antenna 134 may cause the radiation of energy representative of the RF signals via communication channel 114 at a predetermined power level. The antenna 132 of AP 102, for example, may receive the radiated energy and convert the energy into RF signals representative of the data. Circuitry in AP 102 may then decode the RF signal into the data that was received by SM 104 from computer 120. AP 102 may analyze the data to identify the destination for the data. AP 102 may forward the data to the appropriate device on network 110, web server 112 for example.

A device in the communication system 100, access point 102 for example, generates sets of RF signals having a fixed number of frequencies. Typically, the difference between the minimum and maximum frequency of a given set corresponds to the bandwidth of the wireless communication channel. The frequency range of the RF signals, their power levels and the encoding of the data into the RF signals may be defined by a wireless communication standard or may be proprietary. Twenty (20) megahertz and forty (40) megahertz are exemplary wireless communication channel bandwidths.

FIG. 2A illustrates an exemplary set of non-overlapping wireless communication channels 202-216 each having a respective bandwidth. By way of example and without limitation, a 20 MHz wireless communication channel bandwidth is contemplated. Other exemplary bandwidths are 5 MHz, 40 MHz, 80 MHz and 160 MHz. Frequency is represented on the horizontal axis and relative signal strength is represented on the vertical axis. The set of all the frequencies included by the set of wireless communication channels 202-214 corresponds to the frequency band. An exemplary frequency band includes frequencies from 5.1 gigahertz to 5.9 gigahertz. All possible frequencies in the frequency band may be referred to as the frequency spectrum.

The envelope of a wireless communication channel, 202 for example, includes the set or group of frequencies of RF signals generated by a device, AP 102 for example, when communicating via the wireless communication channel 202 for example. Wireless communication channel 114 (FIG. 1) may correspond to wireless communication channel 202, in an embodiment. The values of the frequencies of the RF signals assigned to a wireless communication channel are established by the wireless communication standard and may be configurable. An exemplary wireless communication channel, 202 for example, may be characterized by a center frequency $f_c$ that may represent the average of the frequencies encompassed by wireless communication channel 202. The center frequency may be referred to as the carrier frequency, in some embodiments. As previously mentioned, each wireless communication channel may have a bandwidth of 20 MHz. By way of example and without limitation, a wireless communication channel, channel 202 for example, may be assigned 20 RF signals, each RF signal having a frequency separated from its adjacent RF signals by 1 MHz. Each of the RF signal may be referred to as a subcarrier RF signal and each may be modulated with data before being transmitted. A wireless communication channel having a configurable number of subcarrier RF signals of different frequencies is contemplated.

FIG. 2B illustrates frequency band having an exemplary set of overlapping wireless communication channels 252-260, each having a 40 MHz bandwidth. In an embodiment, wireless communication channel 114 may correspond to wireless communication channel 260.

Figure 3:
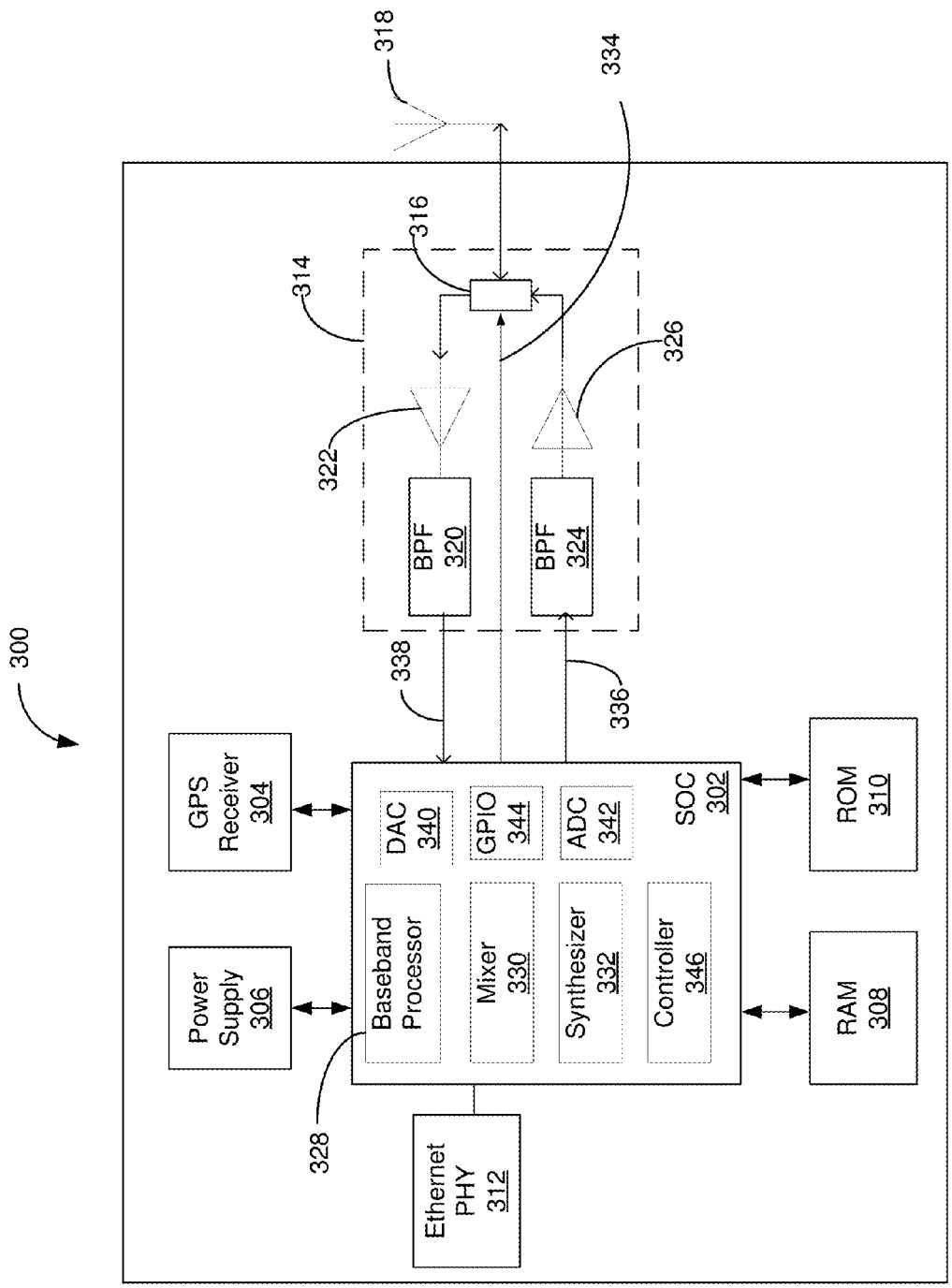
FIG. 3 illustrates an exemplary wireless communication device.

FIG. 3 is block diagram of an exemplary device 300 that may include structures and implement methods that improve the signal quality of the wireless signals representative of data (desirable signals) transmitted by device 300 and filter wireless signals generated by the device 300 that are not representative of the data (noise signals). Signal to Noise ratio (SNR) is one metric of signal quality and represents the level or signal strength of a desired wireless signal relative to the level of background noise. In an embodiment, device 300 may correspond to the AP 102 or the SM 104 of the system 100 of FIG. 1.

In an embodiment, device 300 comprises a system on a chip (SOC) 302, global positioning system (GPS) receiver 304, power supply 306, random access memory (RAM) 308, read only memory (ROM) 310, Ethernet physical layer (PHY) 312, transceiver 314, switch 316 and antenna system 318. In other embodiments, the device 300 may include additional, different or fewer components relative to those shown in FIG. 3. The illustrated embodiment is intended to be exemplary only.

In an embodiment, system on a chip (SOC) 302 includes circuitry and functionality to operate wireless communication device 300. Generally speaking, an SOC is an integrated circuit (IC) that integrates all components of a computer or other electronic system into a single chip. It may contain digital, analog, mixed-signal, and radio-frequency functions—all on a single chip substrate. A typical SOC may include any combination of a microcontroller, microprocessor or digital signal processor (DSP) core, memory blocks including a selection of ROM, RAM, EEPROM and flash memory, timing sources including oscillators and phase-locked loops, peripherals including general purpose input-output (GPIO), counter-timers, real-time timers and power-on reset generators, external interfaces, including industry standards such as USB, FireWire, Ethernet, USART, SPI, analog interfaces including analog to digital convertors (ADCs) and digital to analog convertors (DACs) and voltage regulators and power management circuits.

In an embodiment, SOC 302 may receive data from network 110 (FIG. 1) and may format the received data in accordance with the wireless protocol and generate RF signals that encode the data. Data may be encoded by the phase and amplitude, for example, of the generated RF signals. In an exemplary embodiment, SOC 302 may implement a suitable modulation scheme to encode the data. Exemplary SOCs that perform some or all of the functions ascribed to SOC 302 are available from vendors such as QUALCOMM, BROADCOM and MARVELL.

In an exemplary embodiment, read only memory (ROM) 310 may be adapted to store software instructions that when executed by SOC 302 cause device 300 to receive and transmit data from and to network 110 and wireless communication channel 114. Random access memory (RAM) 308 stores data and software instructions for access by other components such as the SOC 302.

Global positioning system (GPS) receiver 304 is configured to receive GPS signals transmitted by GPS satellite and generate location information for device 300 based on information contained in the received GPS signals. In an embodiment, Ethernet PHY 312 is configured to receive IEEE 802.3 protocol-conforming electrical signals representative of data from network 110 and convert the electrical signals to digital representations of the data. Ethernet PHY 312 is also configured to receive digital data from SOC 302 and convert the received digital data to IEEE 802.3-compliant electrical signals that may be transmitted to network 110. In an embodiment, Ethernet PHY 212 may be electrically coupled to an RJ45 connector. Other connector types are contemplated.

Power supply 306 is configured to generate the various supply voltages required for the operation of device 300. In an embodiment, power supply 306 may include a transformer, a rectifier, a filter and a regulator, for example. In this embodiment, power supply 306 is adapted to receive an AC voltage, 120 V, 60 Hz for example, and convert the AC voltage to one or more DC voltages, 5V and 3.3V for example. In another embodiment, power supply 306 may receive a DC voltage at one voltage level, 24 V for example, and convert the DC voltage to one or more other DC voltages, 5V and 3.3V for example. In a preferred embodiment, a DC voltage may be received via the RJ45 connector. One skilled in the art will recognize this as a power over Ethernet (POE) configuration.

Transceiver 314 comprises a receiver chain, a transmitter chain and a transmit/receive switch 316. The receiver chain comprises band pass filter (BPF) 320 and low noise amplifier (LNA) 322. The transmitter chain comprises a band pass filter 324 and power amplifier 326. In this embodiment, the wireless communication device 300 includes a single transceiver 314 and is referred to as a single in single out (SISO) device. In another embodiment, wireless communication device 300 may include multiple transceivers and may be referred to as a multiple in multiple out (MIMO) device. Increasing the number of transceivers may allow improved data communication rates. In another embodiment, a wireless communication device may include multiple receiver chains and a single transmitter chain and may be referred to as a multiple in single out (MISO) device.

Switch 316 may be operated to connect either the receiver chain or the transmitter chain to antenna system 318. In an exemplary embodiment, transceiver 314 is operated in half-duplex mode. In a half-duplex mode, wireless communication device 300 is operated in either receiver mode or transmitter mode.

In an exemplary embodiment, wireless communication device 300 alternates between receiver mode and transmitter mode. In receiver mode of operation, while wireless communication device 300 is receiving RF signals from remote wireless communication devices via wireless communication channel 114, device 300 does not transmit. In transmitter mode of operation, while wireless communication device 300 is transmitting RF signals via wireless communication channel 114, wireless communication device 300 may not receive data.

In an embodiment, SOC 302 controls the half-duplex operation by controlling the operation of switch 316. In this embodiment, switch 316 may correspond to a single pole double throw switch (SPDT). To receive RF signals from the wireless communication channel 114, SOC 302 operates switch 316 such that an output of antenna system 318 is electrically connected with input of the SOC 302 via LNA 322 and BPF 320. Antenna system 318 may convert received radiant energy into electrical signals. LNA 322 may amplify the received RF signals. BPF 320 may filter RF signals with frequencies that are outside the desired range of frequencies. The filtered received RF signals may be received via receiver input line 338 (RxIn). SOC 302 may then demodulate and decode the filtered RF signals to recover the data.

To cause the transmission of data, SOC 302 may operate the switch 316 to create an electrical path between an output of the SOC 302 and antenna system 318 via BPF 324 and power amplifier 326. SOC 302 may operate switch 316 by using control line 334. SOC 302 may generate RF signals modulated with data to be communicated via wireless communication channel 114. The modulated RF signals may be available at transmitter output (TxOut) 336. BPF 324 may filter the RF signals to remove RF signals of undesirable frequencies. Power amplifier 326 may amplify the filtered RF signals and antenna system 318 may radiate the amplified RF signals as energy. In an exemplary embodiment, antenna system 318 may include a patch antenna or a parabolic dish reflector to increase the signal strength of the transmitted RF signals.

In an exemplary embodiment, SOC 302 comprises a baseband processor 328, a mixer 330, synthesizer 332, DAC 340, ADC 342, GPIO 344 and controller 346. Controller 346 may correspond to a microprocessor or a microcontroller. In an embodiment, controller 346 may coordinate the operation of the other components and functional blocks of SOC 302 and the functioning of wireless communication device 300, generally. In this embodiment, when wireless communication device 300 is operating in transmitter mode, controller 346 may cause baseband processor 328 to generate baseband subcarrier signals having frequencies that range from DC to the bandwidth of the wireless communication channel. This means that if the selected wireless communication channel has a bandwidth of 40 MHz, the maximum frequency of a generated baseband subcarrier signal may be 40 MHz. As another example, if device 300 is configured to communicate using a wireless communication channel with a 20 MHz bandwidth and 20 subcarriers where each subcarrier is spatially separated from its adjacent subcarriers by 1 MHz, baseband processor 328 may generate baseband subcarrier signals having frequencies that range from 1 MHz to 20 MHz. The number of baseband subcarriers generated may be configurable or defined by the wireless communication standard implemented by SOC 302. In an embodiment, baseband processor 328 may synthesize the baseband subcarrier signals using discrete Fourier transform (DFT). In another embodiment, processor 328 may generate subcarrier signals having frequencies that are centered about an intermediate frequency (IF).

In an embodiment, in transmitter mode, baseband processor 328 may modulate the generated baseband subcarrier signals with the data stream to be transmitted. Modulating a subcarrier signal may include changing characteristics of the subcarrier signal based on the binary data to be transmitted. Exemplary characteristics that may be changed include the phase and amplitude of the subcarrier signal. Thus, a change in one or more characteristics of a subcarrier signal may be used to encode one or more bits of the data. The temporal changes in the characteristics of the subcarrier signals may be used to encode a bit stream of binary data. In another exemplary embodiment, baseband processor 328 may utilize a quadrature amplitude modulation (QAM) scheme to encode the binary data to be transmitted. In this embodiment, two digital bit streams corresponding to the data are encoded, by changing (modulating) the amplitudes of two subcarrier RF signals, using the amplitude-shift keying (ASK) digital modulation scheme or amplitude modulation (AM) analog modulation scheme. Modulation schemes may be digitally implemented using the DFT. By increasing the number of subcarrier signals available for encoding data, the instantaneous data throughput represented in bits/sec may be increased. The modulated baseband subcarrier signals may be collectively referred to as a baseband information signal. In an exemplary embodiment, baseband processor 328 may generate a digital representation of the baseband information signal. In this embodiment, digital to analog convertor (DAC) 340 may be operated to convert the digital baseband information signal to an analog representation.

Synthesizer 332 may be configured to generate a carrier RF signal. The generated carrier RF signal may have a frequency that when mixed with the generated modulated baseband signals causes the resulting mixed RF signals to be characterized by a center frequency corresponding to the center frequency $f_c$ of the wireless communication channel, 202 for example. Synthesizer 332 may include a local oscillator that may be programmed to generate the RF signal at this required frequency. In transmitter mode, mixer 330 may be configured to shift the frequencies of modulated subcarrier signals from the baseband frequencies to the RF signal frequencies of the selected wireless communication channel, 202 for example. In an embodiment, the shift may be achieved by mixing the generated carrier RF signal with the baseband or IF modulated subcarrier signals using a process referred to as heterodyning. A typical mixer is a three port non-linear device that may be configured to receive at a first input a first RF signal having a first frequency and at a second input the modulated subcarrier signals at the baseband frequencies. The mixer then generates at its output RF signals at frequencies that are the sum and difference of the frequencies of the RF signals applied to its inputs. The summed frequencies represent the shifted RF signal frequencies and may correspond to the frequencies of the wireless communication channel. The shifted RF subcarrier signals that are modulated with binary data may be collectively referred to as an information signal. In this embodiment, the information signal generated by SOC 302 may consist of the encoded RF subcarrier signals frequencies that occupy the wireless communication channel 202 or 252 characterized by a bandwidth of 20 MHz or 40 MHz and a center frequency fc. The information signal may then be applied to antenna system 318 by way of BPF 324, power amplifier (PA) 326 and switch 316 for transmission via a wireless communication channel. As previously explained a signal may be driven on control line 334 to cause switch 316 to create an electrical path between the output of PA 326 and the antenna system 318. In an exemplary embodiment, control line 334 may be connected with one or more output lines of GPIO 344. Controller 346 may control the operation of GPIO 344 to cause activation of the control line 334 to effectuate operation of switch 316.

In an embodiment, the process of generating, modulating and shifting the various RF subcarrier signals may result in the generation of RF signals that have frequencies that are outside the range of frequencies of the wireless communication channel. For example, baseband processor 302 may generate baseband signals with frequencies that exceed the bandwidth of the wireless communication signals. These may be collectively referred to as baseband noise signals.

The modulated baseband noise signals when mixed by mixer 330 may generate RF noise signals. These RF noise signals are undesirable and may be simply referred to as a noise signal. In this embodiment, SOC 302 may generate a composite RF signal that consists of the information signal and the noise signal. Before being transmitted by antenna system 318, the composite RF signal may be amplified by PA 326.

In an embodiment, the frequencies of the noise signal may correspond to frequencies assigned to another wireless communication channel, 204 for example. As previously mentioned, in an embodiment, device 300 may correspond to AP 102 or SM 104 of system 100, for example. A communication system operating in the proximity of the system 100 may use the other wireless communication channel 204 to communicate. The data transmitted by the proximal communication system via the other wireless communication channel 204 may be corrupted by the amplified noise signals that have frequencies corresponding to the frequencies of the other wireless communication channel 204. In one embodiment, SOC 302 and transceiver 314 implement methods and include circuitry to filter composite RF signals to remove the noise signal component, while leaving intact the information signal component.

In receiver mode, SOC 302 operates to decode data received from remote wireless communication devices via wireless communication channel. Using GPIO 344 and control line 334, controller 346 operates switch 316 to create an electrical path between antenna system 318 and the input of LNA 322. As previously explained, the received RF signals are amplified and filtered by LNA 322 and BPF 320, respectively. The received RF signals may consist of modulated RF subcarrier signals containing encoded data. SOC 302 may receive the filtered RF signal via Rxln 338. Mixer 330 operates to shift the received RF signals to signals having baseband frequencies. This is achieved by mixing the received RF signals with one or more RF signals synthesized by synthesizer 332. The synthesized RF signals may have frequencies centered at the center frequency of the wireless communication channel. One skilled in the art will recognize that the received RF signal may be an analog signal. In an embodiment, analog to digital convertor (ADC) 342 may convert the analog signal to its digital representation. In receiver mode, baseband processor 328 may decode the baseband frequencies to recover the encoded data.

The above described functionality ascribed to the several blocks of SOC 302 may be implemented as software executable instructions, hardware componentry and circuitry or any combination thereof. Embodiments are contemplated where SOC 302 is replaced with a conventional microcontroller and other discrete components.

Figure 4:
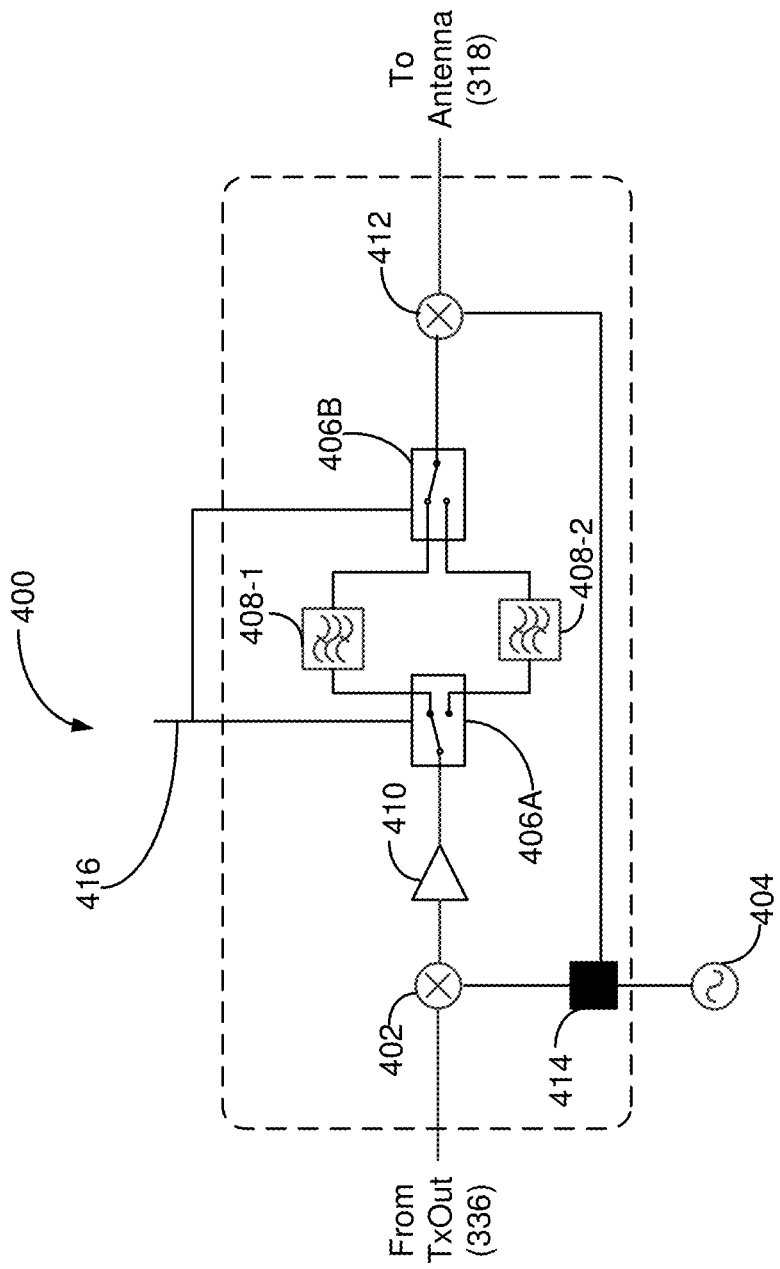
FIG. 4 illustrates an exemplary transmitter chain suitable for filtering a composite RF signal.

FIG. 4 illustrates an exemplary transmitter chain 400 that may operate to filter the noise signals while maintaining or amplifying the power level of the information signals generated by an exemplary wireless communication device, AP 102, for example. In an embodiment, transmitter chain 400 includes mixer 402, local oscillator 404, switches 406A and 406B, band pass filters 408-1 and 408-2, amplifier 410, mixer 412, splitter 414, switch control line 416. Transmitter chain 400 may correspond to transmitter chain comprising PA 326 and BPF 324 of FIG. 3.

Local oscillator (LO) 404 may be operated by a controller, SOC 302 for example, to generate an RF signal. An exemplary LO may include a synthesizer and a voltage controlled oscillator (VCO). SOC 302, using digital or analog control lines connected with the LO 404, may program the LO 404 to generate one or more RF signals having the desired frequencies. HITTITE and ANALOG DEVICES are exemplary vendors that manufacture LO devices suitable for use as LO 404. Splitter 414 may be used to distribute the RF signal generated by LO 404. Exemplary splitters that perform the functions ascribed to splitter 414 are available from ANAREN. In an exemplary embodiment, the RF signal generated by LO 404 may correspond to the difference and/or sum of the center frequency of the wireless communication channel and the intermediate frequency (IF).

Mixer 402 operates to shift down the frequency of a composite RF signal to an intermediate frequency by mixing the received RF signal with the RF signal generated by LO 404. In an exemplary embodiment, the RF signal may be received from the SOC 302 via TxOut 336 and may correspond to a composite RF signal comprising the previously discussed information signals and noise signal. Shifting down the composite RF signals may be referred to as down converting. Down conversing shifts the frequencies of the modulated RF subcarrier signals that together constitute the information signal to signals having frequencies centered about an intermediate frequency that is different from the center frequency of the wireless communication channel. An exemplary intermediate frequency contemplated is 500 MHz. Separately, noise signals may also be appropriately shifted. The signals available at the output of mixer 402 may be amplified by amplifier 410. The amplified signals available at the output of amplifier 410 may be connected to a common terminal of switch 406A.

Switches 406A and 406B may comprise single pole double throw RF switches that may be operated by SOC 302, in an embodiment. In addition, switches 406A and 406B may be provided in a single package or in separate packages. Switch 406A is operable to connect the output of amplifier 410 to a respective input of either one of band pass filter 408-1 and 408-2. Switch 406B is operable to connect a respective output of either one of band pass filters 408-1 and 408-2 to input of mixer 412. In an exemplary embodiment control line 416 is used to operate switches 406A and 406B in concert to insert the selected filter in the path. Embodiments with additional BPFs having different pass band bandwidths and switches 406A and 406B with a corresponding number of poles are contemplated.

The band pass filters (BPFs) 408-1 and 408-2 operate to suppress substantially all signals that have frequencies that are outside their respective pass bands. The pass band of a band pass filter typically corresponds to those frequencies that the filter passes. A signal generated at the output of a BPF corresponds to a filtered signal that includes those signals with frequencies that correspond to the pass band of the BPF. The center frequency of the pass bands of the BPFs may correspond to the intermediate frequency.

In an embodiment, the respective bandwidths of the pass bands of the BPF may be selected to correspond to the different wireless communication channel bandwidths. For example, BPF 408-1 may have a pass band having a bandwidth of 20 MHz and BPF 408-2 may have a pass band having a bandwidth of 40 MHz. If wireless communication device 300 is configured to communicate using a wireless communication channel having a bandwidth of 20 MHZ, 202 for example, SOC 302 may operate switch 406A using control line 416 to connect the output of amplifier 410 to BPF 408-1. SOC 302 may also simultaneously operate switch 406B using control line 416 to connect the output of BPF 408-1 to an input of mixer 412. If however, wireless communication device 300 is configured to communicate using a wireless communication channel having a bandwidth of 40 MHZ, 252 for example, SOC 302 may operate switch 406A using control line 416 to connect the output of amplifier 410 to BPF 408-2. SOC 302 may also simultaneously operate switch 406B using control line 416 to connect the output of BPF 408-2 to an input of mixer 412.

Mixer 412 shifts the amplified, filtered signal to new frequency. The shifting is achieved by mixing the amplified, filtered signal with the signal generated by LO 404. The new frequency may correspond to the center frequency of the wireless communication channel, in an embodiment. Shifting the frequencies back to the frequencies centered about the center frequency of the wireless communication channel may be referred to as up conversion. The output of the mixer 412 may then be transmitted via antenna system 318, in an embodiment.

By way of example, SOC 302 may generate a composite RF signal, consisting of an information signal with 20 modulated RF subcarrier signals having equally spaced frequencies that range from 5720 MHz to 5740 MHz (i.e. 20 MHz bandwidth) and a noise signal that constitutes RF signals with frequencies that range from 5760 MHz to 5770 MHz. The frequencies of the 20 modulated RF subcarrier signals may correspond to frequencies encompassed by a wireless communication channel 202 and the frequencies of the RF signals that constitute the noise signal may correspond to frequencies encompassed by another wireless communication channel 204. The composite signal may be mixed by mixer 402 with a RF signal synthesized by LO 404. SOC 302 may program the LO 404 to generate a signal that when mixed with the composite RF cause the frequencies of the composite RF signal to be shifted such that the shifted signals have frequencies centered around the intermediate frequency, 100 MHz for example. This shifted composite RF signal may be referred to a composite IF signal. The composite IF signal may be available at the common input of switch 406A, in an embodiment.

SOC 302 may operate switch 406A via control line 416 to select the BPF having a pass band that corresponds to the bandwidth of the wireless communication channel. Control line 416 may be connected with GPIO 344 and controlled by controller 346 of SOC 302, in an exemplary embodiment. In this example, SOC 302 operates switch 416 to connect the output of mixer 402 to BPF 408-1 with a pass band of 20 MHz. BPF 408-1 filters all frequencies that are below 490 MHz and above 510 MHz. In this case, the shifted RF signals corresponding to the noise signal with frequencies will be filtered or significantly attenuated. The filtered signals may be amplified by amplifier 410 and the amplified information IF signal may be mixed with the output of LO 404 by mixer 412. After mixing, the signals will have been shifted back to RF signals with frequencies that range from 5720 MHz to 5740 MHz. Thus, the information signal with 20 modulated RF subcarrier signals having equally spaced frequencies that range from 5720 MHz to 5740 MHz may be recovered while the noise signals are filtered. The information signal may then be transmitted by antenna system 318, in an embodiment.

In operation, transmitter chain 400 receives a composite signal consisting of an information signal and a noise signal. The composite signal and its constituent information signal and noise signal are shifted down to frequencies centered about an intermediate frequency. As previously stated, this shifted composite signal may be referred to as composite IF signal and includes the shifted information signal or information IF signal and shifted noise signal or the noise IF signal. The composite IF signal is filtered by a BPF having a pass band corresponding to the bandwidth of the information IF signal to remove the noise IF signal. Before transmitting, the filtered information IF signal is mixed to shift the information IF signal to frequencies corresponding to the frequencies of the wireless communication channel.

Figure 5:
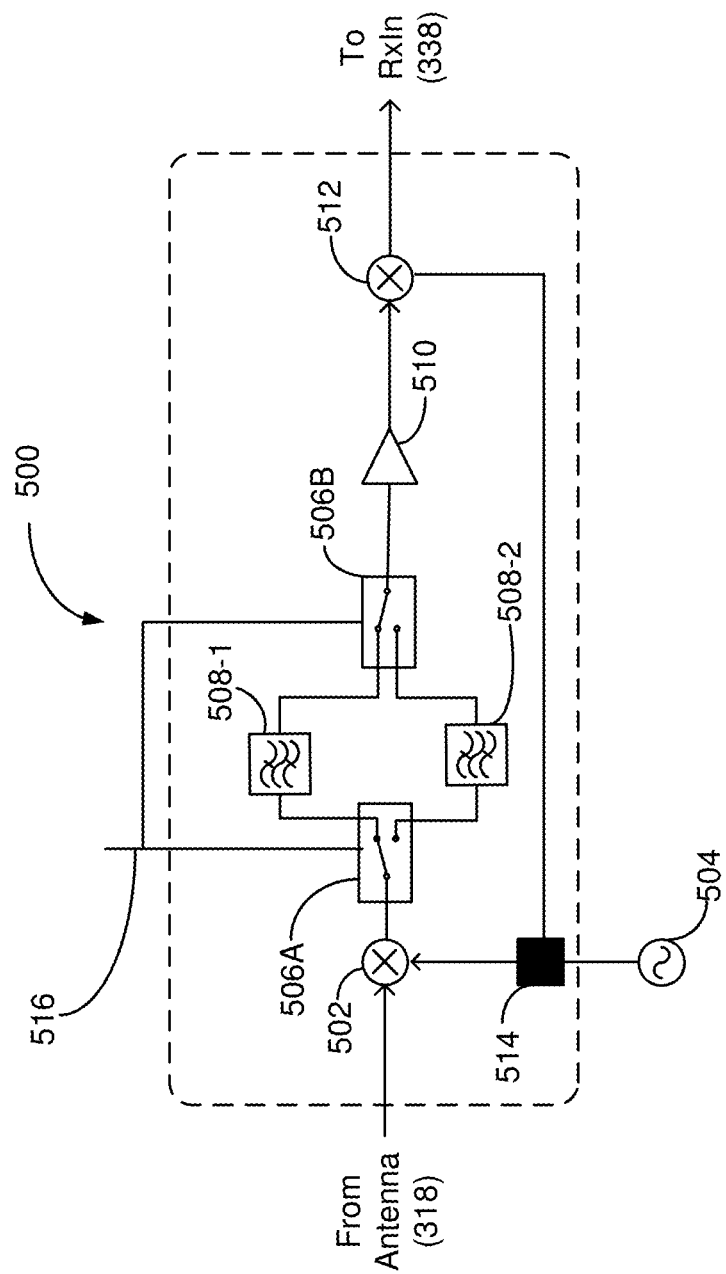
FIG. 5 illustrates an exemplary receiver chain.

FIG. 5 is a block diagram of an exemplary receiver chain 500 that may be employed to signal condition a received RF composite signal. The received RF composite signal may include an RF information signal that includes frequencies of the wireless communication channel and noise signals having frequencies outside the range of frequencies of the wireless communication channel. Receiver chain 500 may correspond to a receiver chain comprising LNA 322 and BPF 320 of FIG. 3 in an embodiment. Receiver chain 500 includes a mixer 502, LO 504, splitter 514, switches 506A and 506B, BPFs 508-1 and 508-2, amplifier 510, switch control line 516 and mixer 512. An input of receiver chain 500 corresponding to an input of mixer 502 may be connected with an antenna, antenna system 318 for example. An output of receiver chain 500 corresponding to an output of mixer 512 may be connected with an input of a signal processing device. In an exemplary embodiment, the signal processing device may correspond to SOC 302. In this embodiment, the output of mixer 512 may be connected with the Rxln 336 input of SOC 302 (FIG. 3).

In an embodiment, LO 504 may be programmed by SOC 302 to generate an RF signal corresponding to the center frequency of the wireless communication channel used for reception of a RF composite signal transmitted, for example, by a remote device. The RF signal generated by the LO corresponds to the center frequency of the wireless communication channel in that it may depend on the desired intermediate frequency (IF) used in receiver chain 500. For example, LO 504 may generate an RF signal with a frequency approximately equal to the center frequency of the RF channel plus the IF. LO 504 may also generate an RF signal with a frequency approximately equal to the center frequency of the RF channel minus the IF. Splitter 514 operates to split the generated RF signal. An output of splitter 514 may be connected with an input of mixer 502.

Mixer 502 operates to shift the frequencies of the received RF composite signal to generate a composite IF signal centered about an intermediate frequency (IF). As previously stated, shifting the composite RF signal includes shifting the constituent information RF signal and the noise RF signal. Shifting is achieved by mixing the received RF composite signal with the RF signal generated by the LO 504. The composite IF signal may be subject to filtering by a BPF characterized by a pass band having bandwidth similar to the bandwidth of the wireless communication channel. In an exemplary embodiment, the composite IF signal may be filtered by either one of BPFs 508-1 or 508-2. The BPF filters the out of band noise IF signal and maintains or passes the information IF signal. BPF 508-1 may have a pass band having a bandwidth of 20 MHz and BPF 508-2 may have a pass band having a bandwidth of 40 MHz. By way of example, receiver chain 500 includes two BPFs with pass band bandwidths that correspond to the two possible bandwidths of a wireless communication channel, 20 MHz and 40 MHz. Embodiments with additional filters including but not limited to band pass filters are contemplated.

Switches 506A and 506B may correspond to single pole double throw RF switches, in an embodiment. In addition, switches 506A and 506B may be provided in a single package or in separate packages. Switch 506A is operable to connect the output of mixer 502 to a respective input of either one of band pass filter 508-1 and 508-2. Switch 506B is operable to connect a respective output of either one of band pass filter 508-1 and 508-2 to input of amplifier 510. In an exemplary embodiment control line 516 is used to operate switches 506A and 506B in concert to insert the selected filter in the signal path. Embodiments with additional BPFs having different pass band bandwidths and switches 506A and 506B with a corresponding number of poles are contemplated.

SOC 302 may operate control line 516 to select the appropriate BPF. For example, if a wireless communication channel having a 20 MHz bandwidth is used for communication, SOC 302 may operate switch 506A to cause the composite IF signal generated at the output of mixer 502 to be applied to an input of the BPF with a 20 MHz bandwidth, BPF 508-1. SOC 302 may also simultaneously operate switch 506B using control line 516 to connect the output of BPF 508-1 to an input of amplifier 510. Switch 506A may be operated by driving a suitable electrical signal on control line 516. Control line 516 may be connected with GPIO 344 in an embodiment. If however, wireless communication device 300 is configured to communicate using a wireless communication channel having a bandwidth of 40 MHZ, 252 for example, SOC 302 may operate switch 506A using control line 516 to cause the composite IF signal generated at the output of mixer 502 to be applied to an input of the BPF with a 40 MHz bandwidth, BPF 508-1. SOC 302 may also simultaneously operate switch 506B using control line 516 to connect the output of BPF 508-2 to an input of amplifier 510. In another embodiment, the switches 506A and 506B and BPFs 508-1 and 508-2 may be replaced with a single BPF whose bandwidth may be appropriately configured by SOC 302 for example.

The filtered composite IF signal available at the output of the BPF 508-1 and 508-2 may be applied to the input of amplifier 510 via switch 506B. Amplifier 510 may amplify the filtered composite IF signal. The amplified, filtered composite IF signal may be mixed with the RF signal generated by the LO 504. The mixing may be performed by mixer 512. Mixing the above mentioned signals causes the frequencies of the amplified and filtered composite IF signal to be shifted to RF signals with frequencies corresponding to frequencies included by the wireless communication channel. By way of reference, as previously discussed the RF signals may be modulated with data. The RF signals may then be received by SOC 302 for further processing including decoding of the data.

Figure 6:
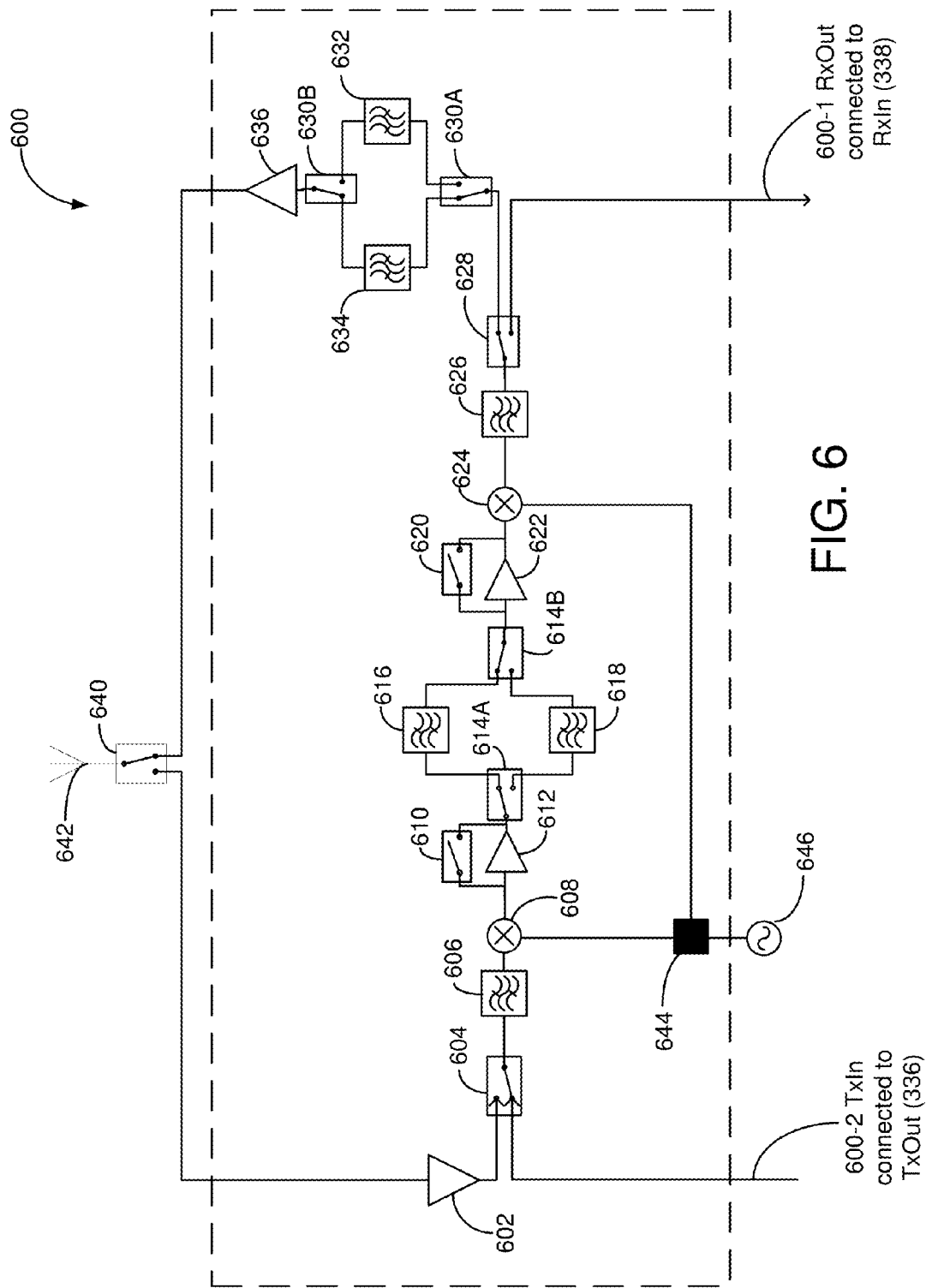
FIG. 6 illustrates an exemplary transceiver suitable for filtering noise signals.

FIG. 6 is a block diagram of an exemplary transceiver 600 that may be used in a wireless communication device, AP 102 or SM 104 of FIG. 1 for example. In an exemplary embodiment, transceiver 600 may embody transceiver 314 of device 300 (FIG. 3). In this embodiment, transceiver 600 is adapted to connect with a SOC 302. Transceiver 600 may be adapted with a receiver output RxOut 600-1 adapted to be connected with RxIn 338 of SOC 302 and a transmitter input TxIn 600-2 adapted to be connected with TxOut 336 of SOC 302.

Separately, transceiver 600 may be connected with an antenna 642 via a T/R switch 640. T/R switch 640 may correspond to a single pole double throw switch (SPDT). In an embodiment, T/R switch 640 may correspond to switch 316 of FIG. 3. The common terminal of T/R switch 640 may be connected with antenna 642. Antenna 642 may correspond to antenna system 318 of FIG. 3.

In an exemplary embodiment, an input of low noise amplifier (LNA) 602 may be connected with a first contact terminal of T/R switch 640. In this embodiment, an output of PA 636 may be connected with a second contact terminal of T/R switch 640. In an exemplary embodiment, T/R switch 640 may be operated by SOC 302. For example, in transmitter mode SOC 302 may activate a control line (not shown) to cause the second contact terminal to be connected with the common terminal. A signal, a previously described composite signal for example, available at the output of PA 636 may be coupled to the antenna 642. Antenna 642 may radiate energy corresponding to coupled signal. In receiver mode, SOC 302 may activate a control line (not shown) to cause the first contact terminal of T/R switch 640 to be connected with its common terminal. RF energy received by antenna 642 may be converted into RF signals and coupled to the input of LNA 602 via the path created by the T/R switch 640.

Transceiver 600 includes a single pole double throw (SPDT) switch 604. One contact terminal of SPDT switch 604 may be connected with an output of LNA 602. A second contact terminal of SPDT switch 604 may be connected with transmitter input TxIn 600-2. In an embodiment, the SPDT switch 604 may be operated by a control line connected with SOC 302. In this embodiment, when device 300 is operating in receiver mode, SOC 302 may operate SPDT switch 604 to connect a common terminal with the output of the LNA 602. When operating in transmitter mode, SOC 302 may operate SPDT switch 604 to connect the common terminal with an output from SOC 302 that carries the generated information signal, TxOut 336 for example.

The common terminal of SPDT switch 604 may be connected with an input of a band pass filter 606. In an embodiment, the pass band of the band pass filter 606 may have bandwidth that spans all frequencies of the frequency band. Band pass filter 606 may filter or attenuate signals with frequencies outside the pass band. For example, the band pass filter 606 may pass all signals having frequencies corresponding to the frequencies of wireless communication channels 202-214 or 252-260 and filter signals that have frequencies that are outside the frequencies of wireless communication channels 202-214 or 252-260. Embodiments where the pass band of band pass filter 606 is less or greater than the band width of the frequency band are contemplated. In other embodiments, the pass band of band pass filter 606 may be programmable and in these embodiments, SOC 302 may set the bandwidth of the pass band to conform to user preference or wireless standard requirements.

An output of band pass filter 606 may be connected with a first input of a mixer 608. The mixer 608 may correspond to mixer 402, in an embodiment. The second input of the mixer 608 may be connected with splitter 644. The splitter 644 may be connected with an output of local oscillator (LO) 646. The LO 646 may be programmed by SOC 302 to generate RF signals having one or more frequencies, in an embodiment. Mixer 608 mixes the received RF signals with the RF signal generated by LO 646 to shift the composite RF signal to signals centered about an IF frequency to generate a composite IF signal. When operating in receiver mode, RF signals including the received information RF and noise RF signals corresponding to energy received via the wireless communication channel are shifted to frequencies centered about the IF frequency. In transmitter mode, the composite signal including the information signal and the noise signal generated by SOC 302 and coupled to the TxIn 600-2 input of transceiver 600 may be shifted to generate a composite IF signal centered about the IF.

The output of mixer 608 may be connected with an input of an amplifier 612 and a bypass switch 610. Amplifier 612 operates to amplify the composite IF signal available at the output of the mixer 608. Bypass switch 610 when closed provides a low loss path for the composite IF signal allowing the IF signals to bypass amplifier 612 without any amplification. When bypass switch 610 is open, the composite IF signal available at the output of mixer 608 are subject to amplification by amplifier 612. In an embodiment, based on the mode of operation, SOC 302 may conditional bypass the amplifier 612 by closing the bypass switch 610. In an embodiment, bypass switch 610 may be a single pole single throw switch. In another embodiment, bypass switch 610 may correspond to a transistor.

In some instances it may be desirable to amplify composite IF signals corresponding to a composite signal generated by SOC 302 for transmission. It may however not be desirable to amplify IF signals corresponding to the received RF signals. In an embodiment, when operating in receiver mode, SOC 302 may cause closure of the bypass switch to cause the composite IF signal to bypass amplification by amplifier 612. Closure of the switch may be effectuated by driving a control signal on a control line that operates bypass switch 610. In an embodiment where a transistor is used as a bypass switch, the control line may correspond to the base of the transistor. In transmitter mode, the bypass switch 610 may be opened to cause the composite IF signal to be amplified.

In an embodiment, the amplified composite IF signal available at the output of amplifier 612 may be selectively subject to band pass filtering by either one of band pass filters 616 and 618. The pass band of filter 616 may correspond to one possible bandwidth of a wireless communication channel, 20 MHz for example. The pass band of filter 616 may correspond to one possible bandwidth of a wireless communication channel, 20 MHz for example. The pass band of filter 618 may correspond to another possible bandwidth of a wireless communication channel, 40 MHz for example. In each of the embodiments, the center frequency of the pass band of the BPFs may correspond to the center IF of the composite IF signal. Based on the bandwidth of the wireless communication channel, SOC 302 may operate filter selector switches 614A and 614B to select the appropriate band pass filter. In addition, switches 614A and 616B may be provided in a single package or in separate packages. In an embodiment, if a wireless communication channel with a bandwidth of 20 MHz is used, 202 for example, SOC 302 may operate switch 614A to cause the composite IF signal to be subject to filtering by band pass filter 616. On the other hand if a wireless communication channel with a bandwidth of 40 MHz is used, 252 for example, SOC 302 may operate switch 614B to cause the composite IF signal to be subject to filtering by band pass filter 618. In an embodiment, switches 614A, 614B, filter 616, and filter 618 may correspond to switches 406A, 406B, filter 408, and filter 410 of FIG. 4. In this embodiment, as previously explained with reference to FIG. 4, in transmitter mode, the selected band pass filter may filter the noise IF signals and pass the information IF signal. In receiver mode, only signals corresponding to RF signals received via the wireless communication channel will be passed.

Embodiments with more than two band pass filters are contemplated. Separately, in some embodiments a single band pass filter with a programmable pass band bandwidth may replace band pass filters 616 and 618. In these embodiments, SOC 302 may set the bandwidth of the pass band. Alternatively, filter selector switches 614A and 614B may be omitted in these embodiments.

In an embodiment, the respective outputs of band pass filters 616 and 618 may be connected to an input of an amplifier 622 and a terminal of a bypass switch 620. The amplifier 622 and bypass switch 620 operate substantially similar to amplifier 612 and bypass switch 610. In an embodiment, when device 300 operates in transmitter mode, amplifier 622 is bypass by closing bypass switch 620. Thus the filtered base band signals available at the outputs of the band pass filters 616 and 618 are not subject to amplification. However, when device 300 operates in receiver mode, bypass switch 620 is opened causing amplification of the filtered signals available at the outputs of the band pass filters 616 and 618 by amplifier 622.

In an embodiment, mixer 624 may mix the filtered composite IF signal with the signal generated by LO 646. Mixer 624 operates to shift the filtered composite IF signal to RF signals with frequencies encompassed by the wireless communication channel. The frequency of the LO signal may be selected based on the center frequency of wireless communication signal and the desired IF. In an embodiment, in transmitter mode, the output of mixer 624 may only include signals from the composite signals corresponding to the information signals, in part because the noise signal was filtered by either one of filters 616 or 618.

The composite RF signal available at the output of mixer 624 may be filtered by BPF 626. The filtered composite RF signal may be selectively coupled to either the receiver input Rxln 338 or the input of switch 630A. For example, in receiver mode SOC 302 may operate switch 628 to cause the composite RF signal to be coupled to Rxln 338. Correspondingly when operating in transmitter mode, SOC 302 may operate switch 628 to cause the composite RF signal to be coupled to the common terminal of switch 630A, in an embodiment.

In transmitter mode, switch 630A may be operated by SOC 302 to couple the composite RF signal to a respective input of either one of the wideband BPFs 632 or 634. Separately, switch 630B may be operated to connect the output of the corresponding wideband BPF to an input of PA 636. For example, if SOC 302 operates switch 630A so as to connect the terminal of switch 628 to the input of BPF 632, SOC 302 may also operate switch 630B to connect BPF 632 to the input of PA 636. In an exemplary embodiment, a single control line may connect a digital output of SOC 302 with control inputs (not shown) of switches 630A and 630B. In this embodiment, SOC 302 may operate both switches in concert to insert the selected BPF 632 or 634 into the path of the RF signal available at the terminal of switch 628. In addition, switches 630A and 630B may be provided in a single package or in separate packages.

In an exemplary embodiment, the pass bands of the BPFs 632 and 634 may be configured to pass frequencies corresponding to different frequency spectrums. For example, BPF 632 may pass all RF signals having frequencies that range from 5100 MHz to 5399 MHz and BPF 634 may pass all RF signals having frequencies that range from 5400 MHz to 5900 MHz, in an embodiment. SOC 302 may select a BPF with a pass band that includes the frequencies of the wireless communication channel selected for communication. By way of example and without limitation, transceiver 600 includes two wideband BPFs 632 and 634. Embodiments with additional BPFs are contemplated. After filtering, the composite RF signal may be amplified by PA 636. The amplified composite RF signal may be coupled to antenna 642 via switch 640. Antenna 642 may convert the composite RF signal to energy and transmit the energy into the wireless communication channel, 202 for example.

In an embodiment, each amplifier described above and its respective bypass switch is integrated in a single package. In another embodiment, each amplifier described above and its respective bypass switch are discrete components.

Figure 7:
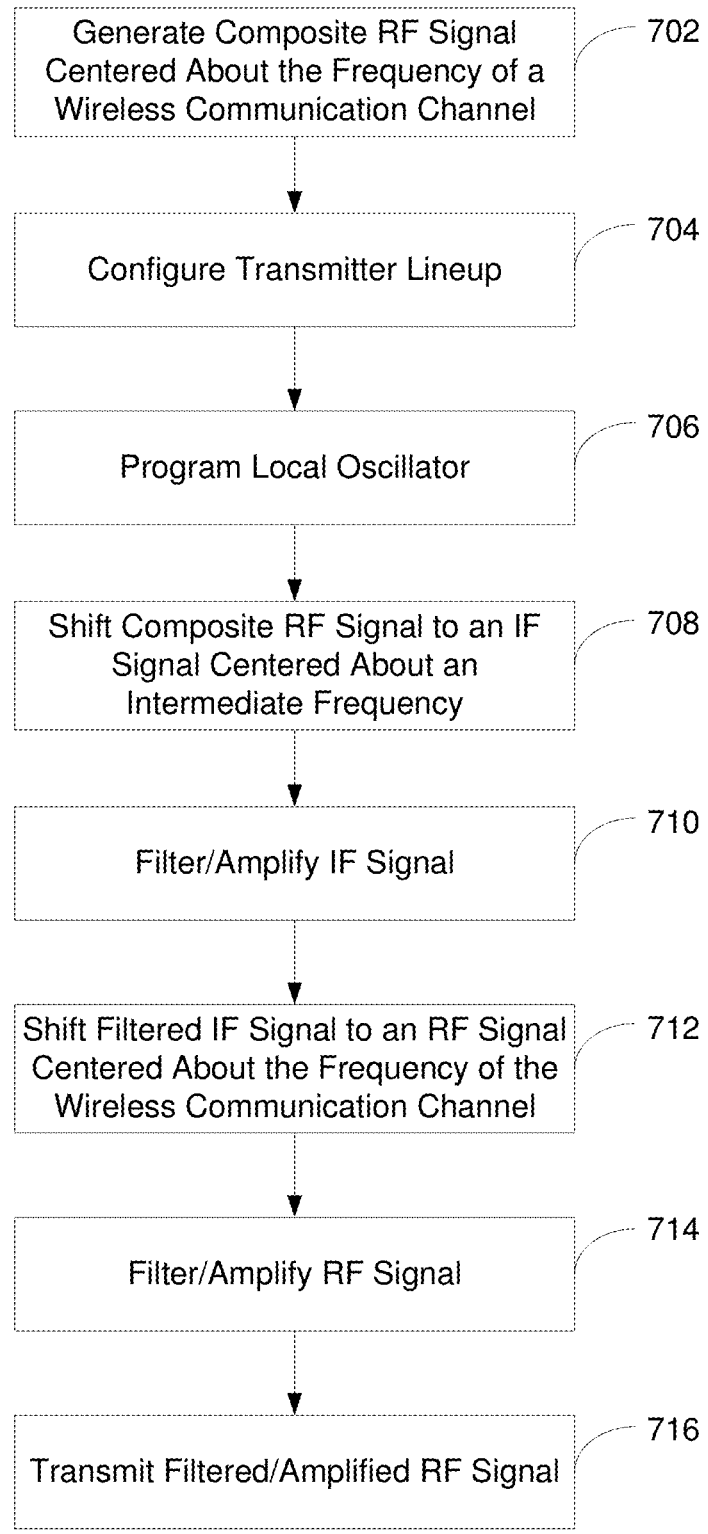
FIG. 7 is a flow diagram of an exemplary method for removing noise signals from a composite signal.

FIG. 7 shows flow diagram 700 illustrating an exemplary method that may be implemented by wireless communication device 300 in accordance with one embodiment, where the RF composite signal received from an SOC is down-shifted (or up-shifted) to an intermediate frequency, filtered, and then up-shifted (or down-shifted) back to an RF signal, amplified, and output to an antenna. For example, at block 702, an SOC (e.g. SOC 302) may generate a composite RF signal centered about a wireless communication channel selected for communication. The composite RF signal may include an information signal that consists of RF subcarrier signals modulated with data. Additionally, the composite RF signal may include noise signals having frequencies that are outside the range of frequencies encompassed by the wireless communication channel selected for communication. In an exemplary embodiment, digital data representative of the RF composite signal may be generated while the wireless communication device 300 is operating in transmit mode. The digital data may be stored in volatile memory such as RAM.

At block 704, the SOC may configure a transceiver (e.g., transceiver 600). Configuring the transceiver may include operating a switch (e.g. switch 604) to connect the output of the SOC to the input of a filter (e.g., filter 606). Also at block 704, a bypass switch (e.g., switch 610) may be opened or closed to either place an amplifier (e.g., amplifier 612) in the signal path or bypass the amplifier. Additionally, in cases where the wireless communication device 300 is configured to communicate using a wireless communication channel having a bandwidth selectable from several different bandwidths, at block 704 the SOC may operate switches (e.g., switches 614A and 614B) to select an appropriate band pass filter (e.g., 616 or 618) having a bandwidth corresponding to the bandwidth of the wireless communication channel. The SOC may also engage or disengage a bypass switch (e.g., switch 620) to either place an amplifier (e.g., amplifier 620) in the signal path or bypass or amplify the signal using an amplifier (e.g., amplifier 620). Further, the SOC may also operate a switch (e.g., switch 628) to cause the filtered composite RF signal to be coupled to filter selection switches (e.g., switch 630A and 630B). The filter selection switches may be operated to select a band pass filter having a pass band corresponding to the bandwidth of the frequency band used for communication. Finally, and also at block 704, the SOC may operate a T/R switch (e.g., switch 640) to connect the transmit path to the antenna (e.g., antenna system 642).

At block 706, the SOC may program an LO (e.g., LO 646) to generate an RF signal of the appropriate frequency, and at block 708, the generated LO signal is mixed with the RF composite signal at block 708 to shift the RF composite signal to an IF signal centered about an intermediate frequency.

At block 710, the IF signal may be filtered (using, e.g., band pass filter 616 or 618) to remove unwanted noise signals and/or may be amplified (using, e.g. amplifiers 612 and/or 622). Then, at block 712, this filtered IF signal is mixed with the LO signal to shift the filtered IF signal back to an RF signal centered about the frequency of the wireless communication channel. At block 714, this RF signal may be filtered (using, e.g., BPF 634 or 632) and/or amplified (using, e.g., PA 636). Finally, at block 716, the amplified RF signal may be transmitted (e.g., using antenna 642).

Figure 8:
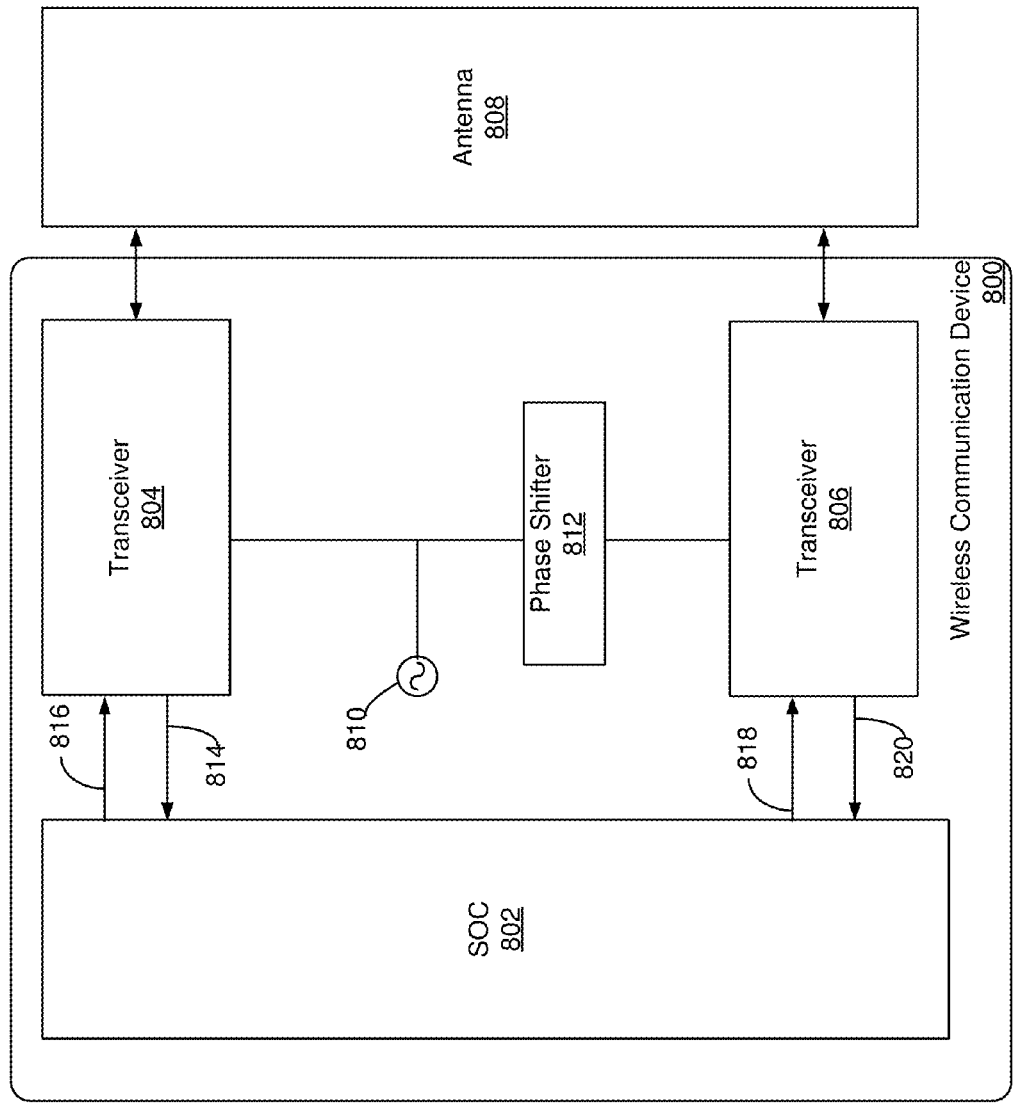
FIG. 8 illustrates an exemplary multiple-in-multiple-out (MIMO) wireless communication device.

FIG. 8 is a block diagram of an exemplary wireless communication device 800. In an embodiment, the wireless communication device 800 include a SOC 802, a first transceiver 804, a second transceiver 806, an antenna 808, local oscillator 810 and phase shifter 812. In part, because the wireless communication device 800 includes multiple transceivers, wireless communication device 800 may be referred to as a MIMO device.

In an exemplary embodiment, wireless communication device 800 may correspond to AP 102 or SM 104 of FIG. 1. In this embodiment, SOC 802 is configured to receive and transmit data via a wired connection. Separately, SOC 802 is configured to generate data representative of RF signals encoded with data to be transmitted via a wireless communication channel and to generate data by decoding data representative of RF signals received via the same or another wireless communication channel, 202 for example. SOC 302 may generate two sets of RF signals for transmission via transceivers 804 and 806 respectively. SOC 302 may receive two sets of RF signals via transceivers 804 and 806 respectively. SOC 802 may include functional blocks similar to those included by SOC 302 in an embodiment.

SOC 802 may be electrically connected to the first transceiver 804 via a receiver input RxIn 814 and a transmitter output TxOut 816. Separately, SOC 802 may be electrically connected to the second transceiver 806 via a receiver input RxIn 820 and a transmitter output TxOut 818. Each set of receiver input and transmitter output lines (i.e. RxIn 814 and TxOut 816; and RxIn 820 and TxOut 818) may correspond to RxIn 338 and TxOut 336 of FIG. 3.

Transceivers 804 and 806 may each correspond to transceiver 600 in an embodiment. In this embodiment, transceiver 804 receives RF signals from SOC 802 via TxOut 816. The RF signals may correspond to the composite RF signal generated by SOC 302 of FIG. 3. SOC 802 may configure transceiver 804 to filter the noise signal portion and amplify the information portion of the composite signal using methods described with reference to FIG. 6. Transceiver 804 may transmit the filtered composite RF signal using antenna 808. Transceiver 804 may separately receive via a wireless communication channel RF signals transmitted by other devices. After performing appropriate signal conditioning similar to that described with reference to FIGS. 5 and 6, transceiver 804 may couple the received RF signals to SOC 802 via RxIn 814.

Transceiver 806 may operate substantially similar to transceiver 804. In an embodiment, transceiver 806 may receive a composite RF signal from SOC 802 via TxOut 818. In this embodiment, transceiver 806 may supply SOC 802 with received RF signals via RxIn 820.

Local oscillator 810 operates to generate one or more RF signals. LO 810 may correspond to LO 646 of FIG. 6. As previously explained, LO 810 may be programmed to generate an RF signal. The programming may be performed by SOC 802, in an embodiment. The generated RF signal may be used by mixers (not shown) of transceivers 804 and 806 to shift the composite RF signal to generate composite IF signal and after filtering the composite IF signal re-shift the composite IF signal to RF signal frequencies of the wireless communication channel.

In one embodiment, the LO signal generated by LO 810 may have a high signal strength. Energy at a frequency corresponding to the frequency of the LO signal may be radiated into the surroundings of the MIMO device 800. In a preferred embodiment, a phase shifter 812 may be utilized to cancel the radiated energy. In this embodiment, phase shifter 812 may be disposed between the output of LO 810 and an input of transceiver 804. Phase shifter 812 operates to shift the phase of the generated LO signal generated by LO 810. The phase shifter may also radiate energy at the frequency corresponding to the frequency of the LO signal. However, the phase of the frequency of the radiated energy will also be appropriately shifted. The energy radiated by LO 810 may interfere with the phase shifted energy radiated by phase shifter 812.

In a preferred embodiment, phase shifter 812 is configured to shift the phase of the LO signal generated by LO 810 by 180 degrees (out of phase). In this embodiment, the energy radiated by phase shifter 812 is out of phase with the energy generated by LO 810. The resulting interference between the out of phase radiant energy cancel each other out.

Figure 9:
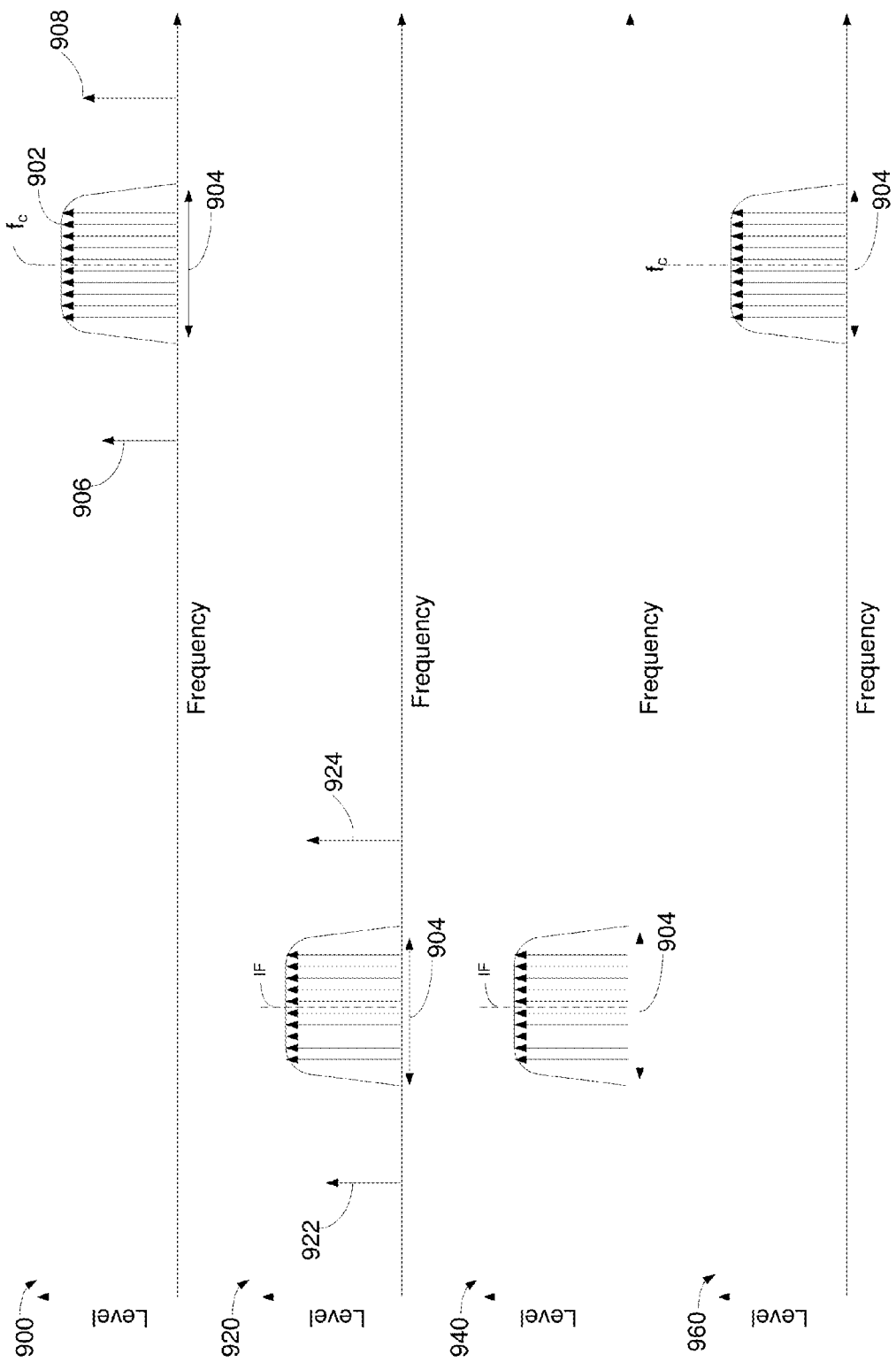
FIG. 9 illustrates signals that may be present at various stages of an exemplary method for removing noise from a composite signal

In the foregoing discussion methods to filter a composite RF signal generated by a low cost SOC are described. Reference is made to FIG. 9 to illustrate the stages of the filtering. FIG. 9 comprises frequency versus signal level graphs 900, 920, 940 and 960. Frequency is depicted along the X axis and signal level of signals at each of the frequencies is depicted along the Y axis. Each of the lines with arrow heads represents a signal at a discrete frequency.

Graph 900 depicts the generated composite RF signal comprising modulated sub carriers that encode the data to be transmitted. The modulated sub carriers have frequencies that span the frequencies of a wireless communication channel 902 having a predetermined bandwidth 904. The composite RF signal also includes noise RF signals 906 and 908 that have frequencies that are outside the frequencies of the wireless communication channel 902. Amplifying and transmitting such a composite RF signal results in the amplified noise RF signals corrupting RF signals transmitted in adjacent wireless communication channels by other devices.

Filtering the composite RF signals at the frequencies of the wireless communication channel is undesirable. In a preferred embodiment, use of a super heterodyne mixer such as mixer 402 (FIG. 4) is contemplated to shift the frequencies of the constituent signals of composite RF signal to frequencies centered about an intermediate frequency (IF). The shifting is achieved by mixing the composite RF signals with a RF signals generated by a local oscillator. Graph 920 depicts the shifted composite RF. The noise RF signals 906 and 908 are shifted to frequencies 922 and 924 respectively and the modulated sub carriers are shifted to frequencies centered about the IF. The modulated sub carriers occupy a similar bandwidth 904.

The shifted signals are subject to filtering by a band pass filter such as 408-1 or 408-2 having a pass band that corresponds to the bandwidth of the wireless communication channel 904 and a center frequency corresponding to the IF. The filtering removes or substantially reduces the signal strength of the shifted noise signals 906 and 908 respectively as illustrated by graph 960.

The resultant filtered composite signals are mixed by another, mixer 412 for example, to shift the sub carrier RF signals and the attenuated noise signals to RF frequencies as illustrated by graph 980.

As is made clear from the figures and description above, the disclosed apparatus and methods advantageously provide filtering of composite RF signals such that the RF signals can be transmitted with an improved SNR. Such filtered signals can then be transmitted at a higher power. Because filtering is performed at an intermediate frequency, the higher cost of low-noise RF-transmitters and/or RF filtering components can be avoided. Accordingly, less expensive (e.g., noisier) components, such as readily available wireless transceiver SOCs, can be used for generating RF signals, filtering the signals, and then transmitting the filtered signals at higher power. Using the above disclosed apparatus and methods, signals generated from inexpensive SOCs may be used at higher powers and over longer ranges than would be normally expected.

The specification and drawings are, accordingly, to be regarded as being illustrative rather than restrictive. It will, however, be evident that various modifications and changes may be made thereunto without departing from the broader spirit and scope of the invention as set forth in the claims.

We claim:

1. A multiple-in-multiple-out device comprising:
  a first transceiver comprising a first down converting mixer, a first band pass filter, and a first up converting mixer;
  a second transceiver comprising a second down converting mixer, a second band pass filter, and a second up converting mixer;
  a local oscillator configured to generate a local oscillator signal; and
  a phase shifter coupled to the local oscillator to apply a phase shift to the local oscillator signal to generate a phase shifted local oscillator signal;
  wherein the multiple-in-multiple-out device is configured to couple the local oscillator signal to the first down converting mixer and to the first up converting mixer and to couple the phase shifted local oscillator signal to the second down converting mixer and to the second up converting mixer,
  wherein the phase shift applied by the phase shifter is configured to cancel energy radiated into the surroundings of the multiple-in-multiple-out device at the frequency of the local oscillator signal,
  wherein the multiple-in-multiple-out device comprises a radio frequency generator comprising a first output and a second output, wherein the first transceiver is connected to the first output and the second transceiver is connected to the second output, and
  wherein the radio frequency generator is configured to generate respective composite radio frequency signals at the first output and the second output, wherein each respective composite radio frequency signal comprises a respective first radio frequency signal having a first frequency and a respective second radio frequency signal having a second frequency and wherein the first frequency belongs to a first frequency band and the second frequency belongs to a second frequency band, the first frequency band being different from the second frequency band.

2. The multiple-in-multiple-out device of claim 1, wherein the phase shifter is configured to phase shift the local oscillator signal by 180 degrees.

3. The multiple-in-multiple-out device of claim 1, wherein the multiple-in-multiple-out device comprises a system on a chip comprising the radio frequency generator.

4. The multiple-in-multiple-out device of claim 1, wherein the first down converting mixer is connected to the first output and the second down converting mixer is connected to the second output.

5. The multiple-in-multiple-out device of claim 4, wherein the first down converting mixer is connected with the first band pass filter, and the second down converting mixer is connected with the second band pass filter.

6. The multiple-in-multiple-out device of claim 5, wherein the first band pass filter is connected to the first up converting mixer and the second band pass filter is connected to the second up converting mixer.

7. The multiple-in-multiple-out device of claim 6, further comprising a first power amplifier connected to an output of the first up converting mixer and a second power amplifier connected to an output of the second up converting mixer.

8. The multiple-in-multiple-out device of claim 7, further comprising a first antenna connected to an output of the first power amplifier and a second antenna connected to an output of the second power amplifier.

9. The multiple-in-multiple-out device of claim 1, wherein a respective output of the first transceiver and the second transceiver is connected with a multiple-in-multiple-out antenna.

10. A method of reducing radiation into the surroundings of a multiple-in-multiple-out device having a first transceiver and a second transceiver, the first transceiver comprising a first down converting mixer, a first band pass filter, and a first up converting mixer and the second transceiver comprising a second down converting mixer, a second band pass filter, and a second up converting mixer,
   wherein the multiple-in-multiple-out device comprises a radio frequency generator comprising a first output and a second output, the method comprising:
generating a local oscillator signal;
applying a phase shift to the local oscillator signal to generate a phase shifted local oscillator signal;
coupling the local oscillator signal to the first down converting mixer and to the first up converting mixer and coupling the phase shifted local oscillator signal to the second down converting mixer and to the second up converting mixer; and
configuring the phase shift to cancel energy radiated into the surroundings of the multiple-in-multiple-out device at the frequency of the local oscillator signal,
connecting the first transceiver to the first output and connecting the second transceiver to the second output, and
configuring the radio frequency generator to generate respective composite radio frequency signals at the first output and the second output, wherein each respective composite radio frequency signal comprises a respective first radio frequency signal having a first frequency and a respective second radio frequency signal having a second frequency and wherein the first frequency belongs to a first frequency band and the second frequency belongs to a second frequency band, the first frequency band being different from the second frequency band.

11. The method of claim 10, comprising applying a phase shift of 180 degrees to the local oscillator signal.

12. The method of claim 10, wherein the multiple-in-multiple-out device comprises a system on a chip comprising the radio frequency generator.

13. The method of claim 10, comprising connecting the first down converting mixer to the first output and connecting the second down converting mixer to the second output.

14. The method of claim 13, comprising connecting the first down converting mixer with the first band pass filter, and connecting the second down converting mixer with the second band pass filter.

15. The method of claim 14, comprising connecting the first band pass filter to the first up converting mixer and connecting the second band pass filter to the second up converting mixer.

16. The method of claim 15, comprising connecting a first power amplifier to an output of the first up converting mixer and connecting a second power amplifier to an output of the second up converting mixer.

17. The method of claim 16, comprising connecting a first antenna to an output of the first power amplifier and connecting a second antenna to an output of the second power amplifier.

18. The method of claim 10, comprising connecting a respective output of the first transceiver and the second transceiver with a multiple-in-multiple-out antenna.

* * * * *